US 6,627,493 B2

United States Patent
Tu et al.

(10) Patent No.: US 6,627,493 B2
(45) Date of Patent: Sep. 30, 2003

(54) SELF-ALIGNED METHOD FOR FABRICATING A CAPACITOR UNDER BIT-LINE (CUB) DYNAMIC RANDOM ACCESS MEMORY (DRAM) CELL STRUCTURE

(75) Inventors: Kuo-Chi Tu, Hsinchu (TW); Chih-Hsing Yu, Hsinchu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 36 days.

(21) Appl. No.: 09/820,390

(22) Filed: Mar. 28, 2001

(65) Prior Publication Data

US 2002/0142539 A1 Oct. 3, 2002

(51) Int. Cl.⁷ .................... H01L 21/8242; H01L 21/44
(52) U.S. Cl. ................ 438/239; 438/244; 438/253; 438/396; 438/399; 438/586; 438/637; 438/638; 438/639; 438/672; 438/675
(58) Field of Search .................. 438/239, 244, 438/253, 256, 396, 399, 586, 599, 637, 638, 639, 672, 675

(56) References Cited

U.S. PATENT DOCUMENTS

| 5,206,183 A | | 4/1993 | Dennison | |
|---|---|---|---|---|
| 5,338,700 A | * | 8/1994 | Dennison et al. | 438/253 |
| 5,488,011 A | * | 1/1996 | Figura et al. | 438/253 |
| 6,043,119 A | * | 3/2000 | Wu et al. | 438/254 |
| 6,083,831 A | | 7/2000 | Dennison | |
| 6,153,491 A | * | 11/2000 | Kotecki et al. | 438/397 |
| 6,180,450 B1 | * | 1/2001 | Dennison et al. | 438/254 |
| 6,184,081 B1 | * | 2/2001 | Jeng et al. | 438/253 |

* cited by examiner

Primary Examiner—Matthew Smith
Assistant Examiner—Lex H. Malsawma
(74) Attorney, Agent, or Firm—Tung & Associates

(57) ABSTRACT

Within a method for fabricating a dynamic random access memory (DRAM) cell structure there is first anisotropically sequentially etched a blanket hard mask layer and a blanket capacitor plate layer which both cover a bit-line source/drain region within the dynamic random access memory (DRAM) cell structure to thus provide a patterned hard mask layer and a patterned capacitor plate layer which define a via. The patterned capacitor plate layer is then isotropically etched and recessed beneath the patterned hard mask layer, while forming from the via an enlarged via. There is then formed over the patterned hard mask layer, and completely filling the enlarged via, an inter-metal dielectric (IMD) layer. There is then anisotropically etched the blanket inter-metal dielectric (IMD) layer to form a patterned inter-metal dielectric (IMD) layer which in part defines a biaxially extended via at the location of the via, wherein portions of the patterned inter-metal dielectric (IMD) layer which define the biaxially extended via passivate sidewall portions of the isotropically etched patterned capacitor plate layer.

15 Claims, 4 Drawing Sheets

SELF-ALIGNED METHOD FOR FABRICATING A CAPACITOR UNDER BIT-LINE (CUB) DYNAMIC RANDOM ACCESS MEMORY (DRAM) CELL STRUCTURE

BACKGROUND OF THE INVENTION

1. Field of the Invention

The present invention relates generally to methods for fabricating dynamic random access memory (DRAM) cell structures within semiconductor integrated circuit microelectronic fabrications. More particularly, the present invention relates to methods for fabricating, with enhanced performance, dynamic random access memory (DRAM) cell structures within semiconductor integrated circuit microelectronic fabrications.

2. Description of the Related Art

Microelectronic fabrications are formed from microelectronic substrates over which are formed patterned microelectronic conductor layers which are separated by microelectronic dielectric layers.

Integral to the fabrication of semiconductor integrated circuit microelectronic fabrications, and in particular to the fabrication of semiconductor integrated circuit microelectronic memory fabrications, is the fabrication of dynamic random access memory (DRAM) cell structures. As is understood by a person skilled in the art, a dynamic random access memory (DRAM) cell structure conventionally comprises a field effect transistor (FET) device in turn having formed contacting one of its source/drain regions a storage capacitor. Within the dynamic random access memory (DRAM) cell structure, a gate electrode within the field effect transistor (FET) device serves as a word line which upon actuation provides for an electrical charge introduction into the storage capacitor or an electrical charge release from the storage capacitor, while a remaining source/drain region within the field effect transistor (FET) device is contacted with a conductor layer which serves as a bit-line conductor layer for providing a conductive path for the electrical charge introduced into the storage capacitor or the electrical charge released from the storage capacitor.

A traditional requirement encountered when fabricating within semiconductor integrated circuit microelectronic fabrications dynamic random access memory (DRAM) cell structures, and in particular within the context of the inevitable conditions where semiconductor integrated circuit microelectronic fabrication device and patterned conductor layer dimensions decrease, is a need to efficiently fabricate storage capacitors with both enhanced capacitance and reduced areal dimensions, such in turn as to provide dynamic random access memory (DRAM) cell structures with enhanced performance.

It is thus desirable in the art of semiconductor integrated circuit microelectronic fabrication to provide methods and materials which may be employed to provide within semiconductor integrated circuit microelectronic fabrications dynamic random access memory (DRAM) cell structures with enhanced performance.

It is towards the foregoing object that the present invention is directed.

Various methods have been disclosed within the art of semiconductor integrated circuit microelectronic fabrication for fabricating, with desirable properties, dynamic random access memory (DRAM) cell structures within semiconductor integrated circuit microelectronic fabrications.

For example, Dennison, in U.S. Pat. No. 5,206,183, discloses a method for fabricating within a semiconductor integrated circuit microelectronic fabrication, and with enhanced registration alignment, a capacitor under bit-line (CUB) dynamic random access memory (DRAM) cell structure. To realize the foregoing result, the method comprises a self-aligned method which employs a plurality of process steps to form within the capacitor under bit-line (CUB) dynamic random access memory (DRAM) cell structure a storage capacitor self-aligned to a bit-line conductor contact stud layer.

In addition, Dennison et al., in U.S. Pat. No. 5,338,700, discloses an additional method for forming within a semiconductor integrated circuit microelectronic fabrication, and with enhanced storage capacitance, an additional capacitor under bit-line (CUB) dynamic random access memory (DRAM) cell structure. To realize the foregoing result, the method also comprises a self-aligned method, but the method also provides that a bit-line conductor stud layer is formed in a self-aligned fashion through an upper capacitor plate layer employed within a storage capacitor employed within the dynamic random access memory (DRAM) cell structure.

Finally, Dennison, in U.S. Pat. No. 6,083,831, discloses a method for forming within a semiconductor integrated circuit microelectronic fabrication, and upon which there may be formed a capacitor node layer with enhanced registration, a conductor contact stud layer employed within a dynamic random access memory (DRAM) cell structure. To realize the foregoing result, the method comprises a self-aligned method wherein the conductor contact stud layer is formed with a contiguous conductor collar layer surrounding its upper periphery.

Desirable in the art of semiconductor integrated circuit microelectronic fabrication, and in particular in the art of semiconductor integrated circuit microelectronic memory fabrication, are additional methods and materials which may be employed for fabricating dynamic random access memory (DRAM) cell structures with enhanced performance.

It is towards the foregoing object that the present invention is directed.

SUMMARY OF THE INVENTION

A first object of the present invention is to provide a method for fabricating within a semiconductor integrated circuit microelectronic fabrication a dynamic random access memory (DRAM) cell structure.

A second object of the present invention is to provide a method in accord with the first object of the present invention, wherein the dynamic random access memory (DRAM) cell structure is fabricated with enhanced performance.

A third object of the present invention is to provide a method in accord with the first object of the present invention and the second object of the present invention, wherein the method is readily commercially implemented.

In accord with the objects of the present invention, there is provided by the present invention a method for fabricating a dynamic random access memory (DRAM) cell structure.

To practice the method of the present invention, there is first provided a semiconductor substrate. There is then formed within and upon the semiconductor substrate a field effect transistor (FET) device comprising a first source/drain region and a second source/drain region formed within the semiconductor substrate and laterally separated by a gate electrode formed upon a gate dielectric layer in turn formed upon the semiconductor substrate. There is then formed in electrical contact with the first source/drain region a capacitor node layer having formed thereupon a capacitor dielectric layer in turn having formed thereupon a capacitor plate layer in turn having formed thereupon a first mask layer, where the capacitor plate layer and the first mask layer cover the second source/drain region. There is then anisotropically etched the first mask layer and the capacitor plate layer to form a patterned first mask layer and a patterned capacitor plate layer which define a via which in turn defines in part the location of a bit-line contact layer to be formed in electrical contact with the second source/drain region. There is then isotropically etched within the via a sidewall of the patterned capacitor plate layer to form an enlarged via defined by an isotropically etched patterned capacitor plate layer recessed beneath the patterned first mask layer. There is then formed over the patterned first mask layer an inter-metal dielectric (IMD) layer which completely backfills the enlarged via. There is then formed over the inter-metal dielectric (IMD) layer a patterned second mask layer which defines an aperture which at least in part overlaps the via. Finally, there is then anisotropically etched, while employing the patterned second mask layer and the patterned first mask layer, the blanket inter-metal dielectric (IMD) layer to form a patterned inter-metal dielectric (IMD) layer which defines a bit-line via which provides electrical contact with the second source/drain region.

The present invention provides a method for fabricating within a semiconductor integrated circuit microelectronic fabrication a dynamic random access memory (DRAM) cell structure, wherein the dynamic random access memory (DRAM) cell structure is fabricated with enhanced performance.

The present invention realizes the foregoing object with respect to a capacitor plate layer having formed thereupon a first mask layer, both of which are formed covering a second source/drain region within a field effect transistor (FET) device to which it is desired to form a bit-line contact within a dynamic random access memory (DRAM) cell structure, by providing: (1) an anisotropic etching of the first mask layer and the capacitor plate layer to form a patterned first mask layer and a patterned capacitor plate layer which define a via which in turn defines in part the location of a bit-line contact layer to be formed in electrical contact with the second source/drain region; (2) an isotropic etching within the via of a sidewall of the patterned capacitor plate layer to form an enlarged via defined by an isotropically etched patterned capacitor plate layer recessed beneath the patterned first mask layer; and (3) after forming over the patterned hard mask layer and completely backfilling the enlarged via with an inter-metal dielectric (IMD) layer in turn having formed thereover a patterned second mask layer which defines an aperture which at least in part overlaps the via, an anisotropic etching, while employing the patterned second mask layer and the patterned first mask layer, of the blanket inter-metal dielectric (IMD) layer to form a patterned inter-metal dielectric (IMD) layer which defines a bit-line via which provides electrical contact with the second source/drain region.

The method of the present invention is readily commercially implemented.

The present invention employs methods and materials as are generally known in the art of semiconductor integrated circuit microelectronic fabrication, but employed within the context of a specific process ordering to provide within the context of the present invention the method for fabricating the dynamic random access memory (DRAM) cell structure in accord with the present invention. Since it is thus at least in part a specific process ordering which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for fabricating within a semiconductor integrated circuit microelectronic fabrication a dynamic random access memory (DRAM) cell structure, wherein the dynamic random access memory (DRAM) cell structure is fabricated with enhanced performance.

The present invention realizes the foregoing object with respect to a capacitor plate layer having formed thereupon a first mask layer, both of which are formed covering a second source/drain region within a field effect transistor (FET) device to which it is desired to form a bit-line contact within a dynamic random access memory (DRAM) cell structure, by providing: (1) an anisotropic etching of the first mask layer and the capacitor plate layer to form a patterned first mask layer and a patterned capacitor plate layer which define a via which in turn defines in part the location of a bit-line contact layer to be formed in electrical contact with the second source/drain region; (2) an isotropic etching within the via of a sidewall of the patterned capacitor plate layer to form an enlarged via defined by an isotropically etched patterned capacitor plate layer recessed beneath the patterned first mask layer; and (3) after forming over the patterned hard mask layer and completely backfilling the enlarged via with an inter-metal dielectric (IMD) layer in turn having formed thereover a patterned second mask layer which defines an aperture which at least in part overlaps the via, an anisotropic etching, while employing the patterned second mask layer and the patterned first mask layer, of the blanket inter-metal dielectric (IMD) layer to form a patterned inter-metal dielectric (IMD) layer which defines a bit-line via which provides electrical contact with the second source/drain region.

The present invention may be employed for fabricating dynamic random access memory cell structures within semiconductor integrated circuit microelectronic fabrications including but not limited to logic non-embedded dynamic random access memory (DRAM) semiconductor integrated circuit microelectronic fabrications and logic embedded dynamic random access memory semiconductor integrated circuit microelectronic fabrications.

Referring now to FIG. 1 to FIG. 7, there is shown a series of schematic cross-sectional diagrams illustrating the results of progressive stages in fabricating within a semiconductor integrated circuit microelectronic fabrication a dynamic random access memory (DRAM) cell structure in accord with the preferred embodiment of the present invention.

Figure 1:
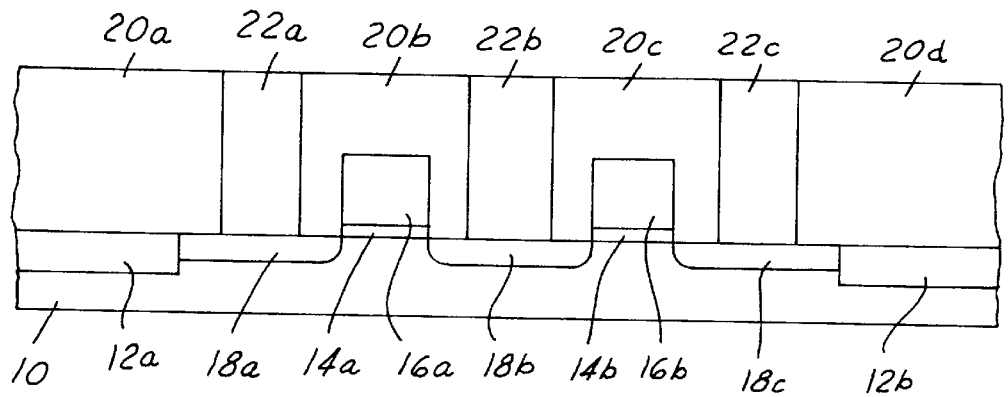
FIG. 1 to FIG. 7 show a series of schematic cross-sectional diagrams illustrating the results of progressive stages of fabricating within a semiconductor integrated circuit microelectronic fabrication a dynamic random access memory (DRAM) cell structure in accord with a preferred embodiment of the present invention.

Shown in FIG. 1 is a schematic cross-sectional diagram of the semiconductor integrated circuit microelectronic fabrication at an early stage in fabrication therein of the dynamic random access memory (DRAM) cell structure in accord with the preferred embodiment of the present invention.

Shown in FIG. 1, in a first instance, is a semiconductor substrate 10 having formed therein and thereupon a pair of isolation regions 12a and 12b which defines an active region of the semiconductor substrate 10.

Within the preferred embodiment of the present invention with respect to the semiconductor substrate 10, and although semiconductor substrates are available with either dopant polarity, several dopant concentrations and several crystallographic orientations, for the preferred embodiment of the present invention the semiconductor substrate 10 is typically and preferably a (100) silicon semiconductor substrate having an N- or a P-dopant concentration. Similarly, although isolation regions are also known in the art of semiconductor integrated circuit microelectronic fabrication to be formed employing methods including but not limited to isolation region thermal growth methods and isolation region deposition/patterning methods, for the preferred embodiment of the present invention, the isolation regions 12a and 12b formed within and upon the semiconductor substrate 10 to define the active region of the semiconductor substrate are typically and preferably formed as shallow trench isolation regions of a silicon oxide dielectric material formed at least in part while employing a deposition/patterning method.

Shown also within the schematic cross-sectional diagram of FIG. 1, and formed within and upon the active region of the semiconductor substrate 10 as defined by the pair of isolation regions 12a and 12b, is a pair of field effect transistor (FET) devices comprising: (1) a pair of gate dielectric layers 14a and 14b formed upon the active region of the semiconductor substrate and in turn having formed aligned thereupon; (2) a corresponding pair of gate electrodes 16a and 16b, the aggregate of which separate; (3) a series of source/drain regions 18a, 18b and 18c formed within remaining portions of the active region of the semiconductor substrate, further wherein the source/drain region 18b is shared by the pair of field effect transistor (FET) devices.

Within the preferred embodiment of the present invention, each of the structures within the foregoing series of structures which comprises the pair of field effect transistor (FET) devices as illustrated within the schematic cross-sectional diagram of FIG. 1 may be formed employing methods and materials as are similarly conventional in the art of semiconductor integrated circuit microelectronic fabrication. For example, and without limitation, each of the pair of gate dielectric layers 14a and 14b may be formed of a silicon oxide gate dielectric material formed to a thickness of from about 50 to about 150 angstroms upon the active region of the semiconductor substrate 10. In addition, and also for example, and also without limitation, each of the pair of gate electrodes 16a and 16b may be formed of a doped polysilicon (having a dopant concentration of greater than about 1E20 dopant atoms per cubic centimeter) or polycide (doped polysilicon/metal silicide stack) gate electrode material formed to a thickness of from about 1000 to about 2000 angstroms and aligned upon each of the corresponding gate dielectric layers 14a and 14b. Finally, and also for example, and also without limitation, each of the series of source/drain regions 18a, 18b and 18b may be formed within the active region of the semiconductor substrate 10 while employing the pair of gate electrodes 16a and 16b as a mask, and while employing an ion implantation method employing a dopant ion of appropriate polarity, at an ion implantation dose of from about 5E13 to about 5E15 dopant ions per square centimeter and an ion implantation energy of from about 10 to about 60 kev.

Finally, there is also shown within the schematic cross-sectional diagram of FIG. 1 a series of patterned planarized pre-metal dielectric (PMD) layers 20a, 20b, 20c and 20d which define a series of contact vias which leave exposed portions of the series of source/drain regions 18a, 18b and 18c, and further wherein there is formed within each of the series of contact vias a corresponding conductor contact stud 22a, 22b or 22c which makes contact with the corresponding source/drain region 18a, 18b or 18c.

Within the preferred embodiment of the present invention with respect to each of the series of patterned planarized pre-metal dielectric (PMD) layers 20a, 20b, 20c and 20d, as well as each of the series of conductor contact studs 22a, 22b and 22c, each of the series of patterned planarized pre-metal dielectric (PMD) layers 20a, 20b, 20c and 20d, as well as each of the series of conductor contact studs 22a, 22b and 22c, may similarly also be formed employing methods, materials and dimensions as are conventional in the art of semiconductor integrated circuit microelectronic fabrication.

For example, and without limitation, the series of patterned planarized pre-metal dielectric (PMD) layers 20a, 20b, 20c and 20d may be formed of dielectric materials including but not limited to generally higher dielectric constant dielectric materials (having a dielectric constant of from about 4.0 to about 8.0, such as but not limited to silicon oxide dielectric materials, silicon nitride dielectric materials, silicon carbide dielectric materials and silicon oxynitride dielectric materials (as generally deposited employing chemical vapor deposition (CVD) methods and physical vapor deposition (PVD) methods) and generally lower dielectric constant dielectric materials (having a dielectric constant of from about 2.5 to about 4.0, such as but not limited to spin-on-glass (SOG) dielectric materials, spin-on-polymer (SOP) dielectric materials and aerogel (i.e., air or insulating gas entrained) dielectric materials, formed and planarized to a thickness of from about 5000 to about 10000 angstroms to define the series of contact vias of aperture width from about 0.2 to about 0.4 microns accessing portions of the source/drain regions 18a, 18b and 18c. In addition, and also for example, and also without limitation, the series of conductor contact studs 22a, 22b and 22c may be formed and planarized into the series of contact vias while being formed of a conductor material selected from the group including but not limited to metal, metal alloy, doped polysilicon and polycide conductor materials.

Figure 2:
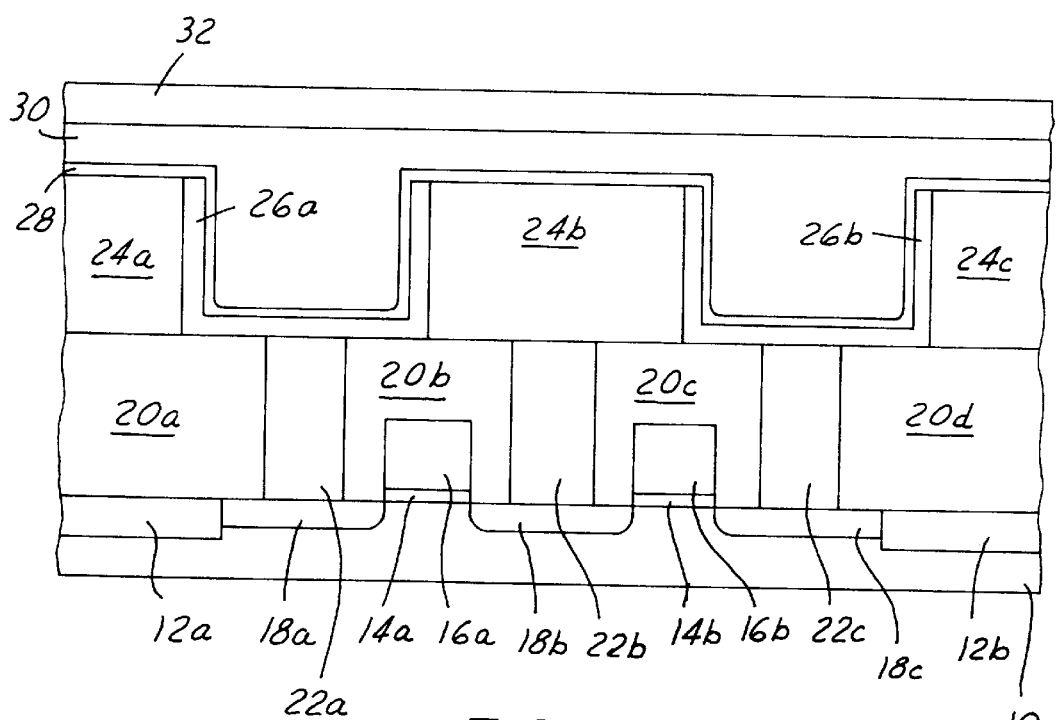

Referring now to FIG. 2, there is shown a schematic cross-sectional diagram illustrating the results of further processing of the semiconductor integrated circuit microelectronic fabrication whose schematic cross-sectional diagram is illustrated in FIG. 1.

Shown in FIG. 2 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 1, but wherein, in a first instance, there is formed upon the semiconductor integrated circuit microelectronic fabrication as illustrated within the schematic cross-sectional diagram of FIG. 1 a series of patterned conductor node dielectric isolation layers 24a, 24b and 24c.

Within the preferred embodiment of the present invention, the series of patterned conductor node dielectric isolation layers 24a, 24b and 24c is typically and preferably formed employing methods and materials analogous or equivalent, but not necessarily identical, to the methods and materials employed for forming the series of patterned planarized pre-metal dielectric (PMD) layers 20a, 20b, 20c and 20d. Typically and preferably, each of the series of patterned conductor node dielectric isolation layers 24a, 24b and 24c is formed to a thickness of from about 8000 to about 12000 angstroms and separated by a distance of from about 0.5 to about 0.8 microns, to form a pair of apertures at the bottoms of which are exposed the pair of conductor contact studs 22a and 22c.

Shown also within the schematic cross-sectional diagram of FIG. 2, and lining each of the pair of apertures defined by the series of patterned capacitor node dielectric isolation layers 24a, 24b and 24c is a pair of capacitor node layers 26a and 26b. Within the preferred embodiment of the present invention, each of the pair of capacitor node layers 26a and 26b may be formed employing methods and capacitor node materials as are conventional in the art of semiconductor integrated circuit microelectronic fabrication, including but not limited to metal, metal alloy, doped polysilicon and polycide capacitor node materials, but most preferably doped polysilicon capacitor node materials, to thus for the pair of capacitor node layers 26a and 26b each of thickness about 500 to about 1000 angstroms and each contacting a corresponding one of the pair of conductor stud layers 22a and 22c.

Shown finally within the schematic cross-sectional diagram of FIG. 2, and covering exposed portions of the series of patterned capacitor node dielectric isolation layers 24a, 24b and 24c, and the pair of capacitor node layers 26a and 26b, is a series of three blanket layers comprising: (1) a blanket capacitor dielectric layer 28 formed upon exposed portions of the series of patterned capacitor node dielectric isolation layers 24a, 24b, 24c and 24d and the pair of capacitor node layers 26a and 26b; (2) a blanket capacitor plate layer 30 formed upon the blanket capacitor dielectric layer 28; and (3) a blanket hard mask layer 32 formed upon the blanket capacitor plate layer 30.

Within the preferred embodiment of the present invention, each of the foregoing three blanket layers may be formed employing methods and materials as are otherwise conventional in the art of semiconductor integrated circuit microelectronic fabrication. In that regard, for example, and without limitation, the blanket capacitor dielectric layer 28 may be formed employing capacitor dielectric materials as are conventional in the art of semiconductor integrated circuit microelectronic fabrication, including but not limited to: (1) silicon oxide capacitor dielectric materials, silicon nitride capacitor dielectric materials and laminate capacitor dielectric materials thereof of generally higher dielectric constant as noted above, as well as; (2) considerably higher dielectric constant dielectric materials, such as but not limited to barium strontium titanate (BST) dielectric materials and lead zirconate titanate (PZT) dielectric materials (having a dielectric constant in a range of from about 200 to about 400. Typically and preferably, the blanket capacitor dielectric layer 28 is formed to a thickness of from about 50 to about 150 angstroms.

In addition, and also for example, and also without limitation, within the preferred embodiment of the present invention with respect to the blanket capacitor plate layer 30, the blanket capacitor plate layer 30 is typically and preferably formed of a capacitor plate material analogous or equivalent to the capacitor node material from which is formed each of the capacitor node layers 26a and 26b (which form a pair of lower capacitor plates while the blanket capacitor plate layer 30 forms an upper capacitor plate) Typically and preferably, the blanket capacitor plate layer 30 is formed to a thickness over each of the pair of capacitor node layers 26a and 26b of from about 500 to about 1500 angstroms.

Finally, and also for example, and also without limitation, within the preferred embodiment of the present invention with respect to the blanket hard mask layer 32, the blanket hard mask layer 32 is typically and preferably formed of a dielectric hard mask material, such as but not limited to a silicon nitride dielectric hard mask material, a silicon carbide dielectric hard mask materials, a silicon oxynitride dielectric hard mask material, a silicon oxycarbide dielectric hard mask material, a silicon carbonitride dielectric hard mask material or a silicon oxycarbonitride dielectric hard mask material, as chosen specifically to provide appropriate etch selectively with respect to other adjacent dielectric layers within a semiconductor integrated circuit microelectronic fabrication derived from the semiconductor integrated circuit microelectronic fabrication whose schematic cross-sectional diagram is illustrated in FIG. 2. Typically and preferably, the blanket hard mask layer 32 is formed to a thickness of from about 500 to about 2000 angstroms.

Figure 3:
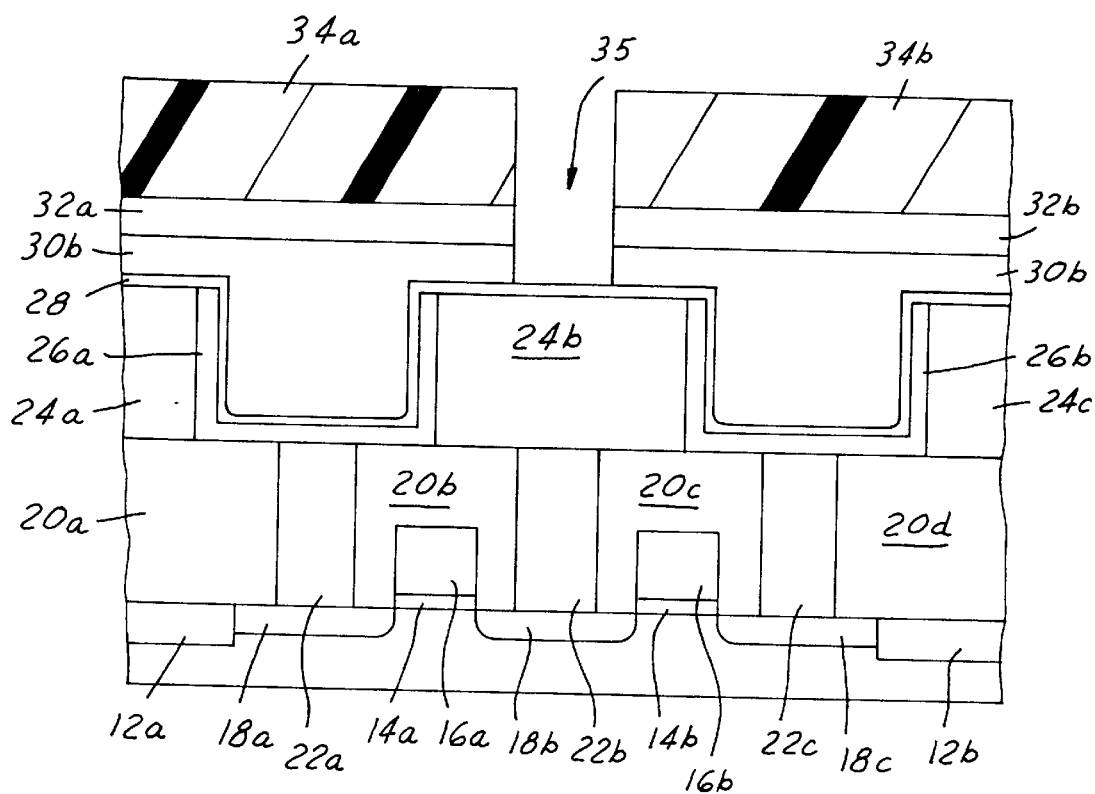

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

Shown in FIG. 3 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2, but wherein, in a first instance, there has been formed upon the blanket hard mask layer 32 a pair of patterned first photoresist layers 34a and 34b.

Within the preferred embodiment of the present invention, the pair of patterned first photoresist layers 34a and 34b may be formed employing photoresist materials as are conventional in the art of semiconductor integrated circuit microelectronic fabrication, including but not limited to photoresist materials selected from the general groups of photoresist materials including but not limited to positive photoresist materials and negative photoresist materials. Typically and preferably, each of the pair of patterned first photoresist layers 34a and 34b is formed to a thickness of from about 5000 to about 8000 angstroms to define a first aperture of aperture width from about 0.2 to about 0.3 microns.

Shown also within the schematic cross-sectional diagram of FIG. 3 is the results of employing the pair of patterned photoresist layers 34a and 34b as an etch mask layer to sequentially: (1) form from the blanket hard mask layer 32 a pair of patterned hard mask layers 32a and 32b; and (2) form from the blanket capacitor plate layer 30 a pair of patterned capacitor plate layers 30a and 30b (although further anisotropic etching into underlying layers is not precluded within the present invention), where the patterned hard mask layers 32a and 32b, in conjunction with the pair of patterned capacitor plate layers 30a and 30b, define a via 35 of aperture width corresponding with the aperture with of the first aperture defined by the separation distance of the pair of patterned first photoresist layers 34a and 34b.

Within the preferred embodiment of the present invention the blanket hard mask layer 32 is patterned to form the pair of patterned hard mask layers 32a and 32b, and the blanket capacitor plate layer 30 is patterned to form the pair of patterned capacitor plate layers 30a and 30b, which in the aggregate form the via 35, while employing the pair of patterned photoresist layers 34a and 34b as an etch mask layer, while employing an anisotropic etch method (typically and preferably an anisotropic plasma etch method), as is generally known in the art of semiconductor integrated circuit microelectronic fabrication. Typically and preferably, the anisotropic plasma etch method sequentially employs a pair of etchant gas compositions as is sequentially appropriate for the materials from which are formed the blanket hard mask layer 32 and the blanket capacitor plate layer 30.

Figure 4:
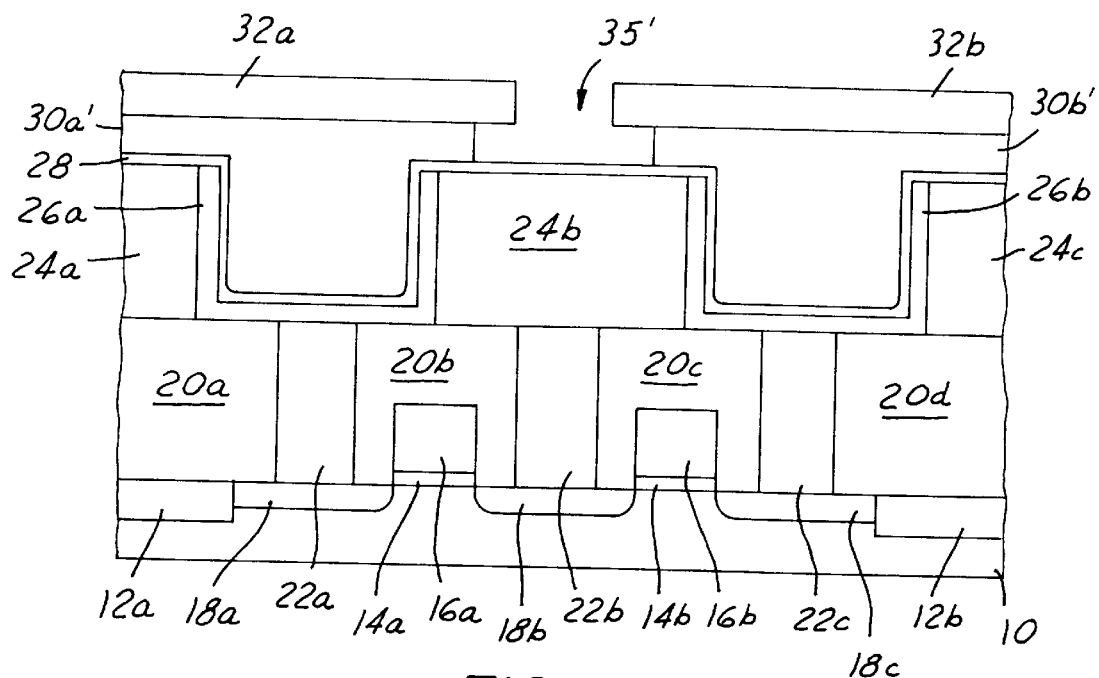

Referring now to FIG. 4, there is shown a schematic cross-sectional diagram illustrating the results of further processing of the semiconductor integrated circuit microelectronic fabrication whose schematic cross-sectional diagram is illustrated in FIG. 3.

Shown in FIG. 4 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3, but wherein, in a first instance, the pair of patterned photoresist layers 34a and 34b has been stripped from the pair of patterned hard mask layers 32a and 32b.

Within the preferred embodiment of the present invention, the pair of patterned photoresist layers 34a and 34b may be stripped from the pair of patterned hard mask layers 32a and 32b while employing photoresist stripping methods and materials as are conventional in the art of semiconductor integrated circuit microelectronic fabrication, such photoresist stripping methods and materials including but not limited to wet chemical photoresist stripping methods and materials and dry plasma photoresist stripping methods and materials.

Shown also within the schematic cross-sectional diagram of FIG. 4 is the results of isotropically etching the pair of patterned capacitor plate layers 30a and 30b to form a pair of isotropically etched patterned capacitor plate layers 30a' and 30b' which are recessed beneath the pair of patterned hard mask layers 32a and 32b, to thus form from the via 35 as illustrated within the schematic cross-sectional diagram of FIG. 3 an enlarged via 35'.

Within the preferred embodiment of the present invention, the pair of patterned capacitor plate layers 30a and 30b may be isotropically etched to form the pair of isotropically etched patterned capacitor plate layers 30a' and 30b' recessed beneath the pair of patterned hard mask layers 32a and 32b while employing isotropic etching methods and materials as are conventional in the art of semiconductor integrated circuit microelectronic fabrication, such isotropic etching methods and materials including but not limited to wet chemical isotropic etching methods and materials and dry plasma isotropic etching methods and materials. Typically and preferably, each of the pair of isotropically etched patterned capacitor plate layers 30a' and 30b' is recessed beneath a corresponding of the pair of patterned hard mask layers 32a and 32b by a recess width of from about 500 to about 1000 angstroms.

As is understood by a person skilled in the art, although FIG. 3 illustrates the results etching both the blanket hard mask layer 32 and the blanket capacitor plate layer 30 while employing the pair of patterned first photoresist layers 34a and 34b as an etch mask layer, and the foregoing description of FIG. 4 discloses that the pair of patterned capacitor plate layers 30a and 30b is isotropically etched after the pair of patterned photoresist layers 34a and 34b is stripped from the pair of patterned hard mask layers 32a and 32b, alternative process sequences are also plausible within the context of the present invention. In that regard: (1) at least the pair of patterned first photoresist layers 34a and 34b is required to pattern the blanket hard mask layer 32; (2) at least the pair of patterned hard mask layers 32a and 32b is required to pattern the blanket capacitor plate layer 30; and (3) at least the pair of patterned hard mask layers 32a and 32b is required to isotropically etch only laterally the patterned capacitor plate layers 30a and 30b.

Figure 5:
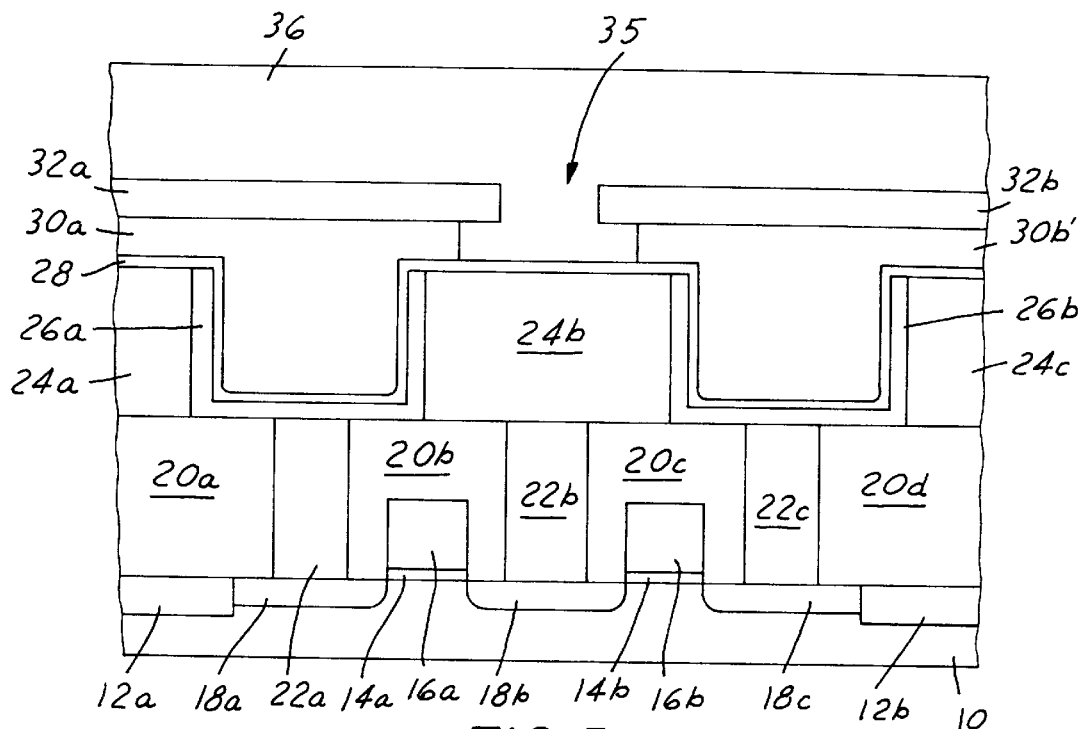

Referring now to FIG. 5, there is shown a schematic cross-sectional diagram illustrating the results of further processing of the semiconductor integrated circuit microelectronic fabrication whose schematic cross-sectional diagram is illustrated in FIG. 4.

Shown in FIG. 5 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 4, but wherein there is formed upon the pair of patterned hard mask layers 32a and 32b and completely filling the enlarged via 35' defined by the pair of patterned hard mask layers 32a and 32b and the pair of isotropically etched patterned capacitor plate layers 30a' and 30b' a blanket inter-metal dielectric (IMD) layer 36.

Within the preferred embodiment of the present invention, the blanket inter-metal dielectric (IMD) layer 36 may be formed upon the pair of patterned hard mask layers 32a and 32b and completely filling the enlarged via 35' defined by the pair of patterned hard mask layers 32a and 32b and the pair of isotropically etched patterned capacitor plate layers 30a' and 30b' while employing methods and materials analogous or equivalent to the methods and materials employed for: (1) forming a blanket pre-metal dielectric (PMD) layer from which is formed the series of patterned planarized pre-metal dielectric layers 20a, 20b, 20c and 20d, as well as; (2) forming a blanket capacitor node dielectric isolation layer from which is formed the series of patterned capacitor node dielectric isolation layers 24a, 24b and 24c. Typically and preferably, the blanket inter-metal dielectric (IMD) layer 36 is formed to a thickness of from about 3000 to about 5000 angstroms upon the pair of patterned hard mask layers 32a and 32b while completely filling the enlarged via 35' defined by the pair of patterned hard mask layers 32a and 32b and the pair of isotropically etched patterned capacitor plate layers 30a' and 30b'.

Figure 6:
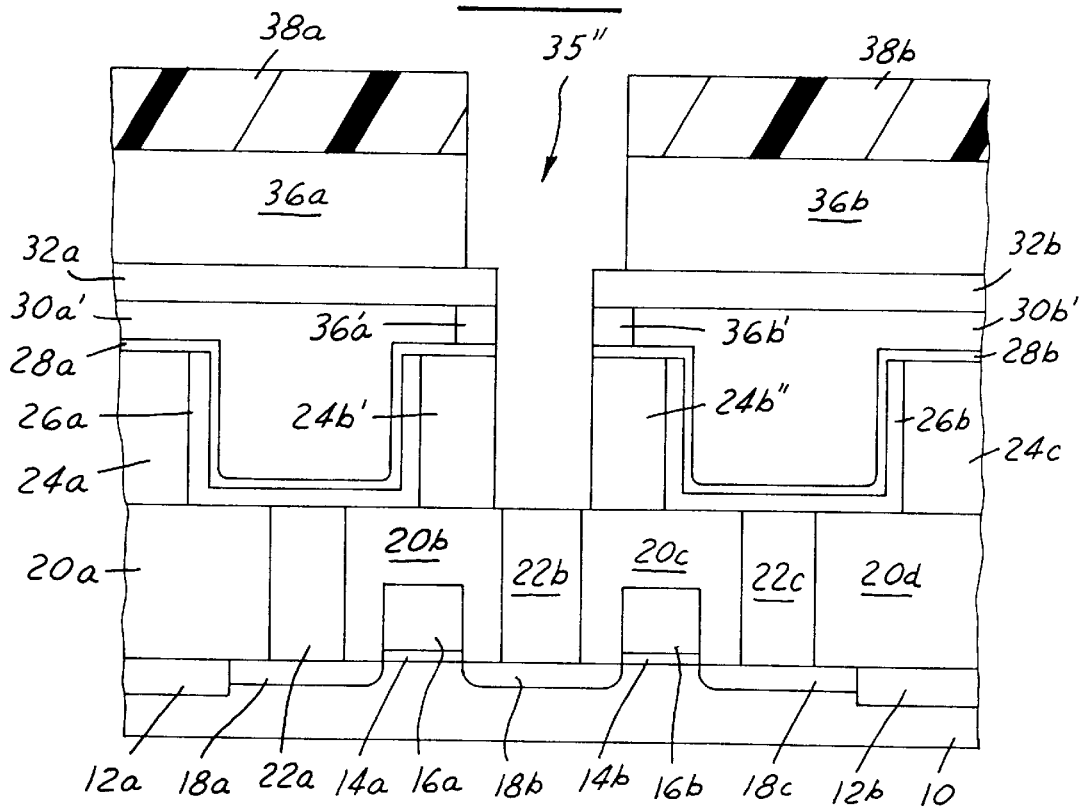

Referring now to FIG. 6, there is shown a schematic cross-sectional diagram illustrating the results of further processing of the semiconductor integrated circuit microelectronic fabrication whose schematic cross-sectional diagram is illustrated in FIG. 5.

Shown in FIG. 6 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 5, but wherein, in a first instance, there is formed a pair of patterned second photoresist layers 38a and 38b upon the blanket inter-metal dielectric (IMD) layer 36, and further where the pair of patterned second photoresist layers 36a and 36b is sized and positioned such as to provide an aperture of dimensions preferably greater than and at least partially overlapping the via 35 as illustrated within the schematic cross-sectional diagram of FIG. 3. Typically and preferably, the pair of patterned second photoresist layers 38a and 38b define a second aperture of aperture width from about 0.3 to about 0.5 microns.

Within the preferred embodiment of the present invention, the pair of patterned second photoresist layers 38a and 38b may otherwise be formed employing methods, materials and thickness dimensions analogous or equivalent to the methods, materials and thickness dimensions employed for forming the pair of patterned first photoresist layers 34a and 34b as illustrated within the schematic cross-sectional diagram of FIG. 3.

Shown also within the schematic cross-sectional diagram of FIG. 6 is the results of employing the pair of patterned second photoresist layers 38a and 38b as an etch mask layer, in conjunction with an anisotropic etch method to: (1) form from the blanket inter-metal dielectric (IMD) layer 36 a pair of patterned inter-metal dielectric (IMD) layers 36a and 36b upon the pair of patterned hard mask layers 32a and 32b, as well as a pair of patterned inter-metal dielectric (IMD) layers 36a' and 36b' passivating a pair of sidewalls of the pair of isotropically etched patterned capacitor plate layers 30a' and 30b'; (2) form from the blanket capacitor dielectric layer 28 a pair of patterned capacitor dielectric layers 28a and 28b; and (3) form from the patterned capacitor node dielectric isolation layer 24b a pair of twice patterned capacitor node dielectric isolation layers 24b' and 24b", while similarly exposing a surface of the conductor contact stud 22b and forming from the via 35 as illustrated within the schematic cross-sectional diagram of FIG. 3 and the enlarged via 35' as illustrated within the schematic cross-sectional diagram of FIG. 4 a biaxially extended via 35" which serves as a bit-line interconnection via accessing the source/drain region 18b through the conductor contact stud 22b.

Within the preferred embodiment of the present invention, each of the foregoing layers may be patterned to provide the corresponding patterned layers while employing a sequence of anisotropic plasma etch methods as are otherwise generally conventional in the art of semiconductor integrated circuit microelectronic fabrication, provided appropriate selection of etchant gas compositions to correspond with the particular materials from which are formed each of the foregoing layers.

Figure 7:
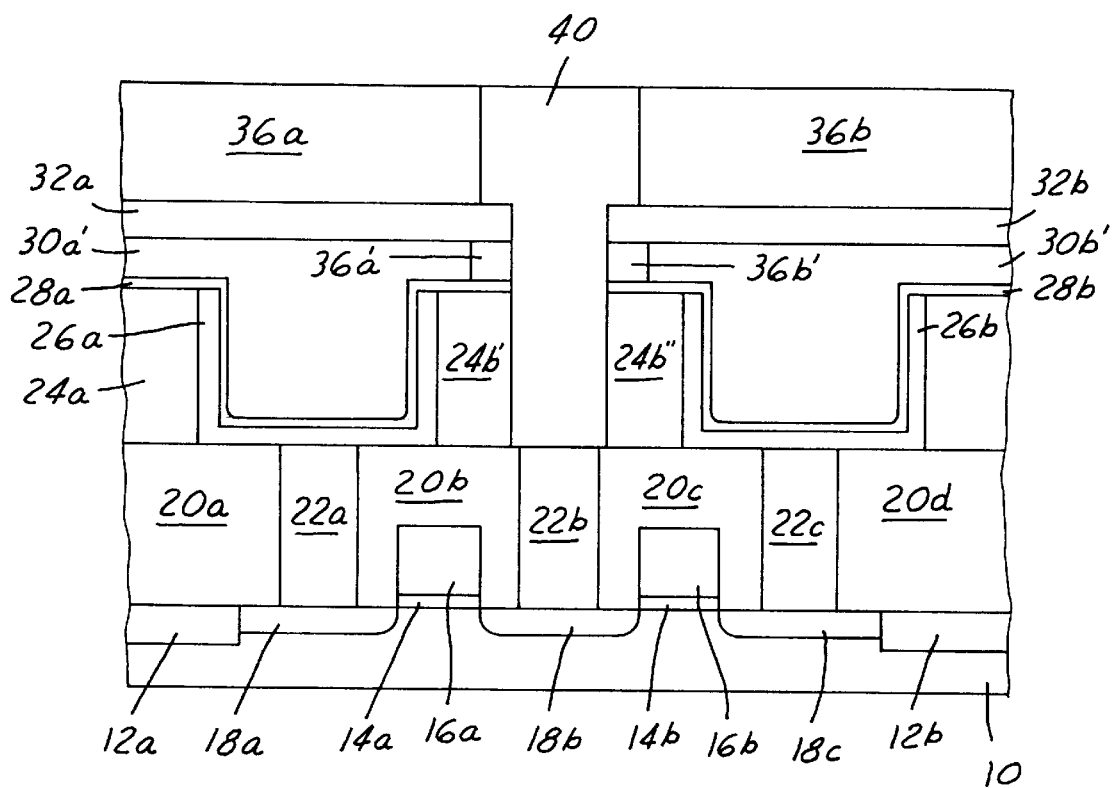

Referring now to FIG. 7, there is shown a schematic cross-sectional diagram illustrating the results of further processing of the semiconductor integrated circuit microelectronic fabrication whose schematic cross-sectional diagram is illustrated in FIG. 6.

Shown in FIG. 7 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 6, but wherein, in a first instance, the pair of patterned second photoresist layers 38a and 38b has been stripped from the pair of patterned inter-metal dielectric (IMD) layers 36a and 36b.

Within the preferred embodiment of the present invention, the pair of patterned photoresist layers 38a and 38b as illustrated within the semiconductor integrated circuit microelectronic fabrication whose schematic cross-sectional diagram is illustrated in FIG. 6 may be stripped from the pair of patterned inter-metal dielectric (IMD) layers 36a and 36b to provide in part the semiconductor integrated circuit microelectronic fabrication whose schematic cross-sectional diagram is illustrated in FIG. 7 while employing methods and materials analogous or equivalent to the methods and materials as employed for stripping from the patterned hard mask layers 32a and 32b as illustrated within the semiconductor integrated circuit microelectronic fabrication whose schematic cross-sectional diagram is illustrated in FIG. 3 the pair of patterned first photoresist layers 34a and 34b to provide in part the semiconductor integrated circuit microelectronic fabrication whose schematic cross-sectional diagram is illustrated in FIG. 4.

Finally, there is also shown within the schematic cross-sectional diagram of FIG. 7 a conductor interconnect stud layer 40 formed into the biaxially extended via 35" defined by the pair of patterned inter-metal dielectric (IMD) layers 36a and 36b, the pair of patterned hard mask layers 32a and 32b, the pair of patterned inter-metal dielectric (IMD) layers 36a' and 36b', the pair of patterned capacitive dielectric layers 28a and 28b and the pair of twice patterned capacitor node dielectric isolation layers 24b' and 24b".

Within the preferred embodiment of the present invention, the conductor interconnect stud 40 may be formed into the biaxially extended via 35" defined by the pair of patterned inter-metal dielectric (IMD) layers 36a and 36b, the pair of patterned hard mask layers 32a and 32b, the pair of patterned inter-metal dielectric (IMD) layers 36a' and 36b', the pair of patterned capacitive dielectric layers 28a and 28b and the pair of twice patterned capacitor node dielectric isolation layers 24b' and 24b", to thus serve as a bit-line contact layer, while employing methods and materials as are otherwise conventional in the art of semiconductor integrated circuit microelectronic fabrication and otherwise analogous or equivalent to the methods and materials employed for forming the series of conductor contact studs 22a, 22b and 22c into the series of apertures defined by the series of patterned planarized pre-metal dielectric layers 20a, 20b, 20c and 20d.

Upon forming the semiconductor integrated circuit microelectronic fabrication whose schematic cross-sectional diagram is illustrated in FIG. 7, there is formed a semiconductor integrated circuit microelectronic fabrication having formed therein a dynamic random access memory (DRAM) cell structure with enhanced performance. The method of the present invention realizes the foregoing object at least in part by backfilling completely, after isotropically etching a pair of patterned capacitor plate layers which define in part a via, to form a pair of isotropically etched patterned capacitor plate layers which define in part an enlarged via, the enlarged via with an inter-metal dielectric (IMD) layer, before anisotropically etching in part through the inter-metal dielectric (IMD) layer a biaxially extended via in a fashion such that portions of a patterned inter-metal dielectric (IMD) layer formed from the inter-metal dielectric (IMD) layer which in part define the biaxially extended via passivate a pair of sidewalls of the pair of isotropically etched patterned capacitor plate layers.

As is understood by a person skilled in the art, the preferred embodiment of the present invention is illustrative of the present invention rather than limiting of the present invention. Revisions and modifications may be made to methods, materials, structures and dimensions employed for fabricating a dynamic random access memory (DRAM) cell structure in accord with the preferred embodiment of the present invention while still providing a method for fabricating a dynamic random access memory (DRAM) cell structure in accord with the present invention, further in accord with the accompanying claims.

What is claimed is:

1. A method for fabricating a dynamic random access memory (DRAM) cell structure comprising:

providing a semiconductor substrate;

forming within and upon the semiconductor substrate a field effect transistor (FET) device comprising a first source/drain region and a second source/drain region formed within the semiconductor substrate and laterally separated by a gate electrode formed upon a gate dielectric layer in turn formed upon the semiconductor substrate;

forming in electrical contact with the first source/drain region a capacitor node layer having formed thereupon a capacitor dielectric layer in turn having formed thereupon a capacitor plate layer in turn having formed thereupon a first mask layer, where the capacitor plate layer and the first mask layer cover the second source/drain region;

anisotropically patterning the first mask layer and the capacitor plate layer to form a patterned first mask layer and a patterned capacitor plate layer which define a via which in turn defines in part the location of a bit-line contact layer to be formed in electrical contact with the second source/drain region;

isotropically etching within the via a sidewall of the patterned capacitor plate layer to form an enlarged via defined by an isotropically etched patterned capacitor plate layer recessed beneath the patterned first mask layer;

forming over the patterned first mask layer an inter-metal dielectric (IMD) layer which completely backfills the enlarged via;

forming over the inter-metal dielectric (IMD) layer a patterned second mask layer which defines an aperture which at least in part overlaps the via; and anisotropically etching, while employing the patterned second mask layer and the patterned first mask layer, the blanket inter-metal dielectric (IMD) layer to form a patterned inter-metal dielectric (PAD) layer which defines a bit-line via which provides electrical contact with the second source/drain region.

2. The method of claim 1 further comprising forming into the bit-line via the bit-line conductor layer.

3. The method of claim 2 wherein the bit-line conductor layer is separated from the second source/drain region by a second conductor stud layer.

4. The method of claim 1 wherein the capacitor plate layer is formed from a conductor material selected from the group consisting of metal, metal alloy, doped polysilicon and polycide conductor materials.

5. The method of claim 1 wherein the capacitor plate layer is formed to a thickness of from about 500 to about 1500 angstroms.

6. The method of claim 1 wherein first mask layer is formed from a dielectric material selected from the group consisting of silicon oxide dielectric materials, silicon nitride dielectric materials, silicon carbide dielectric materials, silicon oxynitride dielectric materials, silicon oxycarbide dielectric materials, silicon carbonitride dielectric materials and silicon oxycarbonitride dielectric materials.

7. The method of claim 1 wherein the first mask layer is formed to a thickness of from about 500 to about 2000 angstroms.

8. The method of claim 1 wherein when isotropically etching the patterned capacitor plate layer there is employed an isotropic etchant selected from the group consisting of wet chemical isotropic etchants and dry plasma isotropic etchants.

9. The method of claim 1 wherein the via is formed to an aperture width of from about 0.2 to about 0.3 microns.

10. The method of claim 1 wherein the isotropically etched patterned capacitor plate layer is recessed beneath the patterned first mask layer by a lateral recess width of from about 500 to about 1000 angstroms.

11. The method of claim 1 wherein the aperture is formed to an aperture width of from about 0.3 to about 0.5 microns.

12. The method of claim 1 wherein the inter-metal dielectric (IMD) layer is formed of an inter-metal dielectric (IMD) material selected from the group consisting of chemical vapor deposition (CVD) deposited dielectric materials, physical vapor deposition (PVD) deposited dielectric materials, spin-on-glass (SOG) dielectric materials and spin-on-polymer (SOP) dielectric materials, laminates thereof and aggregates thereof.

13. The method of claim 1 wherein the inter-metal dielectric (IMD) layer is formed to a thickness of from about 3000 to about 5000 angstroms.

14. The method of claim 1 wherein the capacitor node layer is separated from the first source/drain region by a first conductor stud layer.

15. A method for fabricating a dynamic random access memory (DRAM) cell structure comprising:

providing a semiconductor substrate;

forming within and upon the semiconductor substrate a field effect transistor (FET) device comprising a first source/drain region and a second source/drain region formed within the semiconductor substrate and laterally separated by a gate electrode formed upon a gate dielectric layer in turn formed upon the semiconductor substrate;

forming in electrical contact with the first source/drain region a capacitor node layer having formed thereupon a capacitor dielectric layer in turn having formed thereupon a capacitor plate layer in turn having formed thereupon a first mask layer, where the capacitor plate layer and the first mask layer cover the second source/drain region;

anisotropically patterning the first mask layer and the capacitor plate layer to form a patterned first mask layer and a patterned capacitor plate layer which define a via which in turn defines in part the location of a bit-line contact layer to be formed in electrical contact with the second source/drain region;

isotropically etching within the via a sidewall of the patterned capacitor plate layer to form an enlarged via defined by an isotropically etched patterned capacitor plate layer recessed beneath the patterned first mask layer;

forming over the patterned first mask layer an inter-metal dielectric (IMD) layer which completely backfills the enlarged via;

forming over the inter-metal dielectric (IMD) layer a patterned second mask layer which defines an aperture which at least in part overlaps the via; and anisotropically etching, while employing the patterned second mask layer and the patterned first mask layer, the blanket inter-metal dielectric (IMD) layer to form a patterned inter-metal dielectric (IMD) layer which defines a bit-line via which provides electrical contact with the second source/drain region, wherein when anisotropically etching the blanket inter-metal dielectric (IMD) layer to form the patterned inter-metal dielectric (IMD) layer, a residue portion of the patterned inter-metal dielectric (IMD) layer passivates a sidewall of the isotropically etched patterned capacitor plate layer.

* * * * *